United States Patent

Horie

[11] Patent Number: 5,894,548
[45] Date of Patent: Apr. 13, 1999

[54] SEMICONDUCTOR DEVICE HAVING TEST CIRCUIT

[75] Inventor: Tetsuro Horie, Tokyo, Japan

[73] Assignee: Kabushiki Kaisha Toshiba, Kawasaki, Japan

[21] Appl. No.: 08/810,291

[22] Filed: Mar. 3, 1997

Related U.S. Application Data

[63] Continuation of application No. 08/408,882, Mar. 24, 1995, abandoned.

[30] Foreign Application Priority Data

Mar. 29, 1994  [JP]  Japan ..................... 6-058613

[51] Int. Cl.$^6$ ................................. G01R 31/28
[52] U.S. Cl. ..................... 395/183.06; 371/22.31
[58] Field of Search ................... 371/22.31, 22.32, 371/22.33, 22.34, 22.35, 22.36; 395/183.06

[56] References Cited

U.S. PATENT DOCUMENTS

| | | | |
|---|---|---|---|
| 4,879,718 | 11/1989 | Sanner | 371/22.3 |
| 5,127,008 | 6/1992 | Bassett et al. | 371/22.3 |
| 5,329,188 | 7/1994 | Sikkink et al. | 327/18 |
| 5,389,843 | 2/1995 | McKinney | 327/276 |
| 5,467,354 | 11/1995 | Yamauchi | 371/22.3 |
| 5,526,365 | 6/1996 | Whetsel | 371/22.3 |

Primary Examiner—Joseph Palys
Attorney, Agent, or Firm—Banner & Witcoff

[57] ABSTRACT

Test data is set in the flip-flop of a test circuit via a scan path in the test mode. A timing converting section forms a plurality of update signals of different timings in the test mode. A multiplexer formed in the test circuit selects one update signal from the plurality of update signals according to a timing converting signal stored in a register. The test data set in the flip-flop is supplied to the internal circuit at a timing defined by the selected update signal. That is, the update signal and timing converting signal are used to control the input timing of test data supplied to the internal circuit for each test circuit.

22 Claims, 4 Drawing Sheets

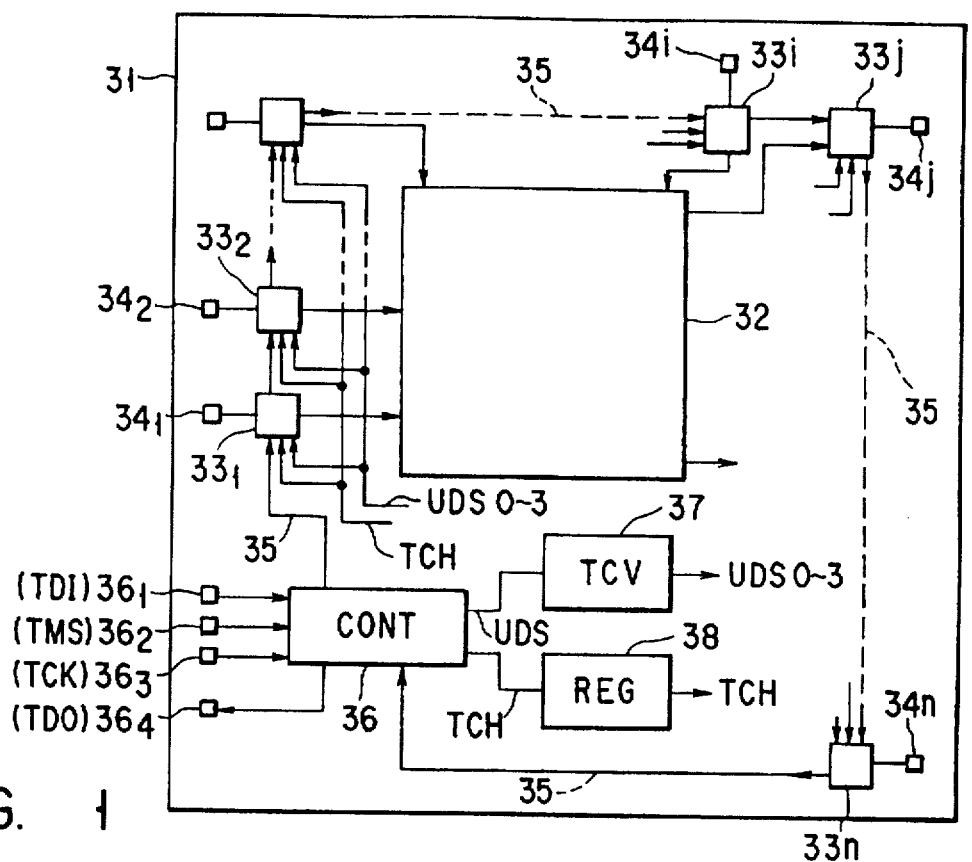
F I G. 1
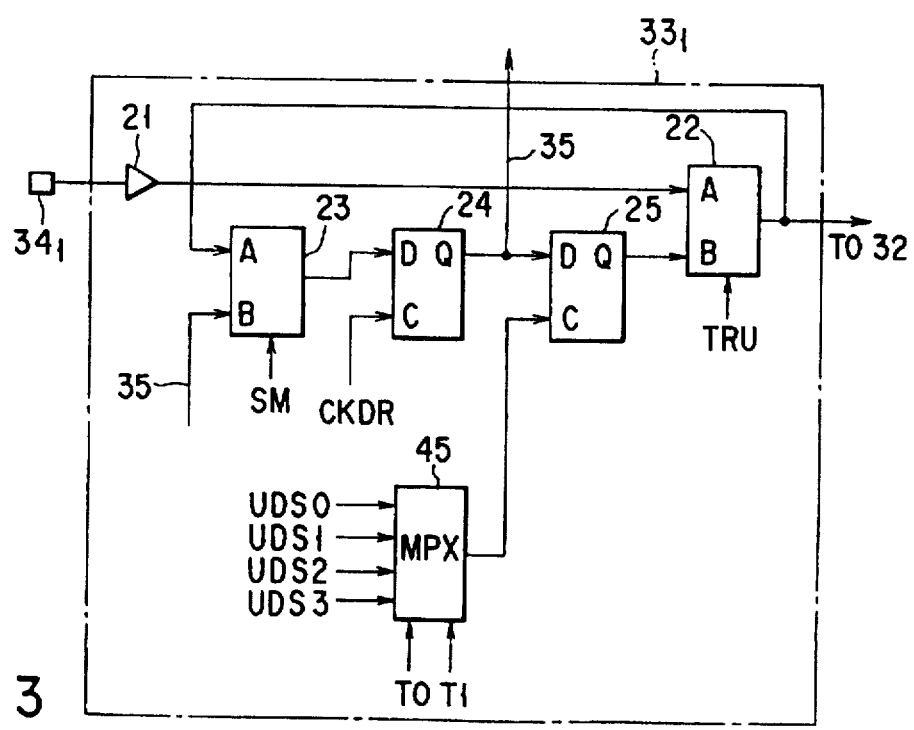
F I G. 3

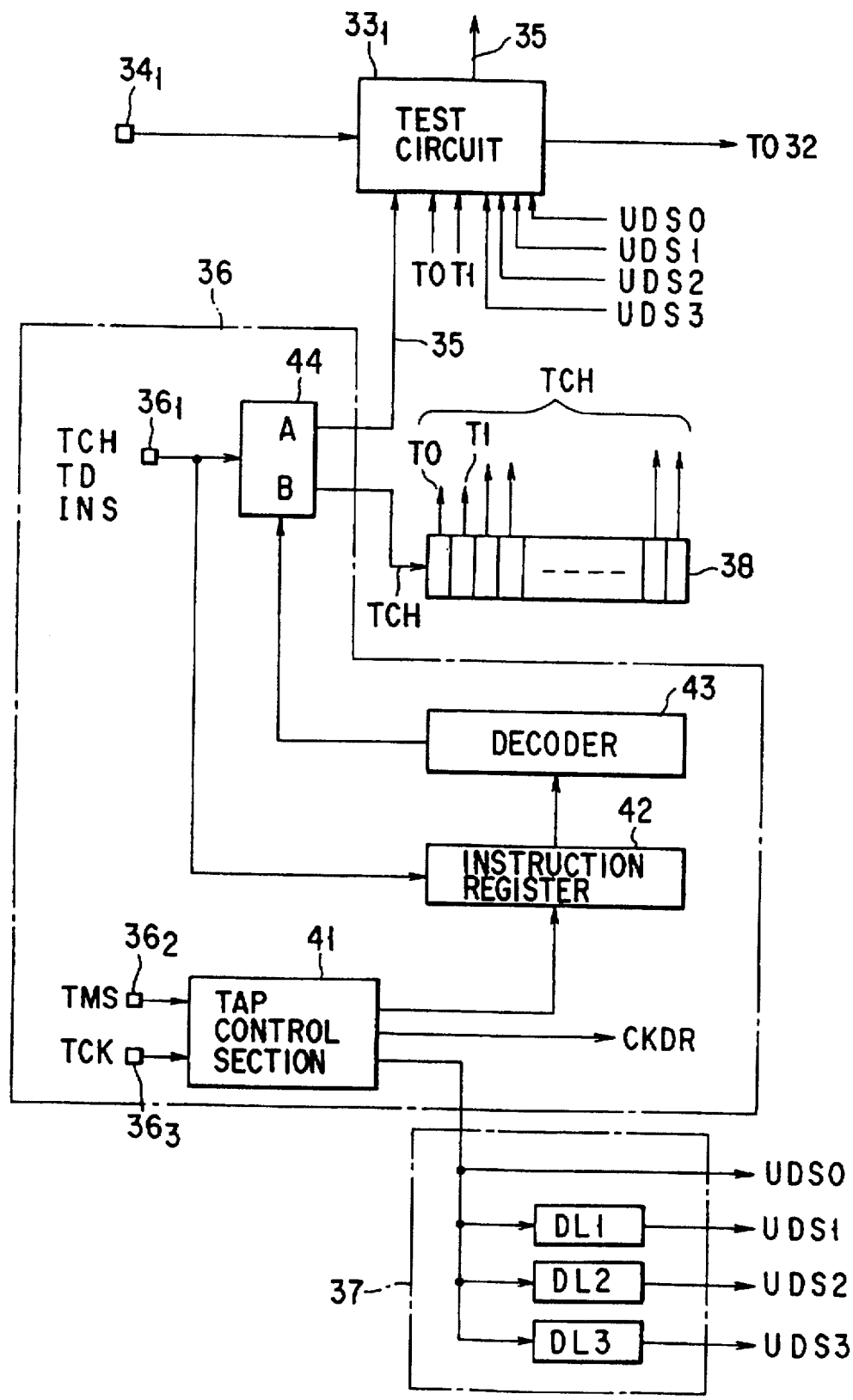
F I G. 2

SEMICONDUCTOR DEVICE HAVING TEST CIRCUIT

This application is a continuation of application Ser. No. 08/408,882 filed Mar. 24, 1995, now abandoned.

BACKGROUND OF THE INVENTION

1. Field of the Invention

This invention relates to a semiconductor integrated circuit, for example, and more particularly to a semiconductor integrated circuit having test circuits called a boundary scan test circuit for evaluating the characteristic thereof.

2. Description of the Related Art

As is well known in the art, in order to make an in-circuit test of a semiconductor integrated circuit device mounted on a printed circuit board, conventionally, a probe connected to the tester is brought into contact with the external terminal of the semiconductor integrated circuit, a signal necessary for the test is input via the probe and an output signal for the input signal is received. However, in the present semiconductor integrated circuit device, the pitch of the external terminals becomes extremely small with further development of the packaging technique. Particularly, it becomes difficult to correctly set the probe in contact with only one of the pins of the semiconductor chip on the surface mounting type package. For this reason, various test methods have been developed. As one of the test methods, the boundary scan test has been provided.

FIG. 5 shows a semiconductor integrated circuit device having a conventional boundary scan test circuit contained therein. In a semiconductor substrate 11, an internal circuit 12 such as a microprocessor is formed, for example. A plurality of test circuits $13_1$ to $13_n$ called boundary scan cells are arranged around the internal circuit 12. The test circuits $13_1$ to $13_i$ are respectively connected to input pads $14_1$ to $14_i$ and the test circuits $13_j$ to $13_n$ are respectively connected to output pads $14_j$ to $14_n$. In the normal operation mode, the test circuits $13_1$ to $13_i$ supply signals supplied from the input pads $14_1$ to $14_i$ to the internal circuit 12 and the test circuits $13_j$ to $13_n$ output signals output from the internal circuit 12 to the output pads $14_j$ to $14_n$. The test circuits $13_1$ to $13_n$ are serially connected via a scan path 15 in the boundary scan test mode so as to function as a so-called shift register. One end of the shift register is connected to a test data input pad 16 and the other end thereof is connected to an output pad 17 for outputting test data.

FIG. 6 shows the construction of the test circuit $13_1$. The data inputting test circuits $13_1$ to $13_i$ have the same construction. The input pad $14_1$ is connected to one input terminal of a multiplexer acting as selection means via an input buffer 21. The output terminal of the multiplexer 22 is connected to the internal circuit 12 and to one input terminal of a multiplexer 23. The other input terminal of the multiplexer 23 is connected to the test data input pad 16 via the scan path 15. The multiplexer 23 is controlled by a shift mode changing signal SM and the output terminal of the multiplexer 23 is connected to the input terminal of a flip-flop circuit 24. The clock signal input terminal of the flip-flop circuit 24 is supplied with a shift clock signal CKDR for shifting test data in the test mode, and the output terminal thereof is connected to a next stage test circuit (not shown) via the scan path 15 and to the input terminal of a flip-flop circuit 25. The clock signal input terminal of the flip-flop circuit 25 is supplied with an update signal UDS used as a timing signal for supplying test data held in the flip-flop circuit 24 to the internal circuit 12 in the test mode and the output terminal thereof is connected to the other input terminal of the multiplexer 22. The multiplexer 22 is supplied with a switching signal TRU, and the multiplexer 22 selects an output signal of the input buffer 21 in the normal operation mode and selects an output signal of the flip-flop circuit 25 in the boundary scan test mode according to the switching signal TRU.

With the above construction, test data supplied from the test data input pad 16 is serially set into the flip-flop circuits 24 of the test circuits $13_1$ to $13_i$ in response to the shift clock signal CKDR. Test data set in each of the test circuits $13_1$ to $13_i$ is transferred to the internal circuit 12 in response to the update signal UDS and signals output from the internal circuit 12 are transferred to the test circuits $13_j$ to $13_n$.

In the conventional boundary scan test, test data is simultaneously supplied to the internal circuit 12 at a preset timing defined by the update signal UDS with the test data set in the test circuits $13_1$ to $13_i$. It is necessary to input the test data items to the respective input pins (not shown) of the internal circuit 12 at preset timings. For example, in a case where test data items of two steps shown in FIG. 8A are supplied to input pins P1 to P4 (not shown) of the internal circuit 12 at such preset timings as shown in FIG. 7, it is necessary to convert data shown in FIG. 8A to data shown in FIG. 8B before transferring the data. That is, in the boundary scan test, data cannot be input to a plurality of test circuits $13_1$ to $13_i$ in parallel, but is serially input. For this reason, in order to supply test data set in the test circuits $13_1$ to $13_i$ at timings shown in FIG. 7 by the update signal UDS, it is necessary to previously convert data shown in FIG. 8A to data shown in FIG. 8B according to the timings shown in FIG. 7. That is, data shown in FIG. 8B divides data shown in FIG. 8A into a plurality of steps at level-shifting points of the waveforms shown in FIG. 7. In the actual test, the operation of setting the thus converted test data into each of the test circuits for each step, and then, supplying each test data set by the update test signal to the internal circuit is repeatedly effected.

Thus, in the conventional boundary scan test circuit, test data items set in the respective test circuits are simultaneously supplied to the internal circuit. For this reason, when parallel test data whose input timing is previously defined is converted into serial test data, the test data must be divided into a plurality of steps according to the input timing. Therefore, the number of steps of the test data is increased and time for the test becomes longer.

SUMMARY OF THE INVENTION

An object of this invention is to provide a semiconductor integrated circuit device capable of preventing an increase in the number of steps of test data and reducing time for the test.

The above object can be attained by a semiconductor integrated circuit device having test circuits, comprising a semiconductor substrate having an internal circuit for processing signals formed therein; a plurality of pads arranged around the internal circuit on the semiconductor substrate; a plurality of test circuits arranged around the internal circuit and respectively connected to the pads, for supplying signals supplied from the pads to the internal circuit in the normal operation mode; a scan path for serially connecting the test circuits; a control section connected to one end of the scan path, for sequentially supplying test data to the test circuits via the scan path and generating a first update signal for transferring the test data to the internal circuit in the test mode; a timing converting circuit connected to the control section, for generating a plurality of second update signals having different delay times based on the first update signal supplied from the control section and respectively supplying the second update signals to the test circuits; wherein each of the test circuits supplies the test data to the internal circuit in response to a corresponding one of the second update signals supplied from the timing converting circuit.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a circuit construction diagram concretely showing one embodiment of this invention;

FIG. 2 is a circuit diagram concretely showing the main portion of the circuit of FIG. 1;

FIG. 3 is a circuit diagram concretely showing the main portion of the circuit of FIG. 1;

DETAILED DESCRIPTION OF THE PREFERRED EMBODIMENT

Figure 4:
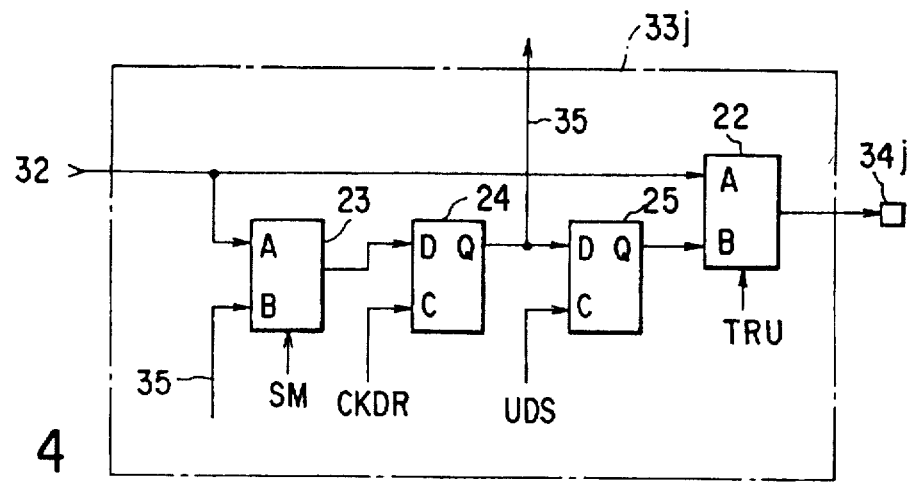
FIG. 4 is a circuit diagram concretely showing the main portion of the circuit of FIG. 1.
Figure 5:
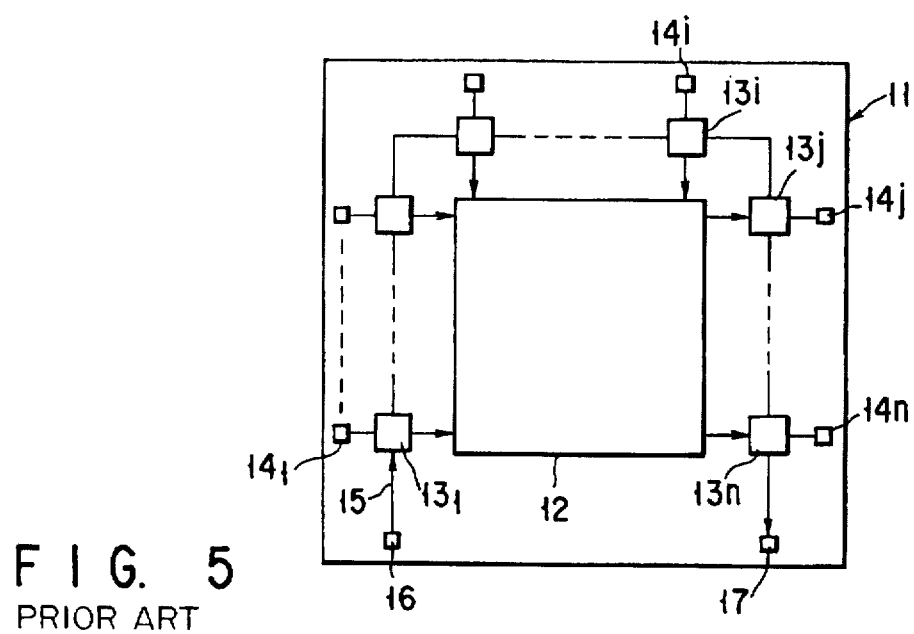
FIG. 5 is a circuit construction diagram for illustrating the conventional boundary scan test.

There will now be described an embodiment of this invention with reference to the accompanying drawings.

As shown in FIG. 1, an internal circuit 32 such as a microprocessor is formed in a semiconductor substrate 31. A plurality of test circuits $33_1$, $33_2$ to $33_n$ are arranged around the internal circuit 32. The test circuits $33_1$, $33_2$ to $33_i$ are connected to input pads $34_1$, $34_2$ to $34_i$ and the test circuits $33_j$ to $33_n$ are connected to output pads $34_j$ to $34_n$. In the normal operation mode, the test circuits $33_1$, $33_2$ to $33_i$ supply signals supplied from the input pads $34_1$, $34_2$ to $34_i$ to the internal circuit 32, and the test circuits $33_j$ to $33_n$ supply signals output from the internal circuit 32 to the output pads $34_j$ to $34_n$. The test circuits $33_1$ to $33_n$ are serially connected via a scan path 35 and acts as a so-called shift register in the boundary test mode. One end and the other end of the scan path 35 are connected to a control section (CONT) 36. The control section 36 effects the input/output control in the boundary scan test mode.

The control section 36 is connected to pads $36_1$ to $36_4$. The pad $36_1$ is used as a test input terminal (TDI) and is supplied with a timing switching signal (TCH), test data (TD) and test instruction (INS) which will be described later from a tester (not shown). The pad $36_2$ used as a test mode input terminal is supplied with a test mode selection signal (TMS) for selecting a test mode. The pad $36_3$ used as a test clock input terminal is supplied with a test clock signal (TCK). The pad $36_4$ acting as a test data output terminal (TDO) is used to output the result of test.

Further, the control section 36 is connected to a timing converting section 37 and register 38. The timing converting section 37 converts an update signal UDS output from the control section 36 into a plurality of update signals UDS0 to UDS3 of different timings. The update signals UDS0 to UDS3 output from the timing converting section 37 are supplied to each of the test circuits $33_1$ to $33_n$. The register 38 holds a timing converting signal TCH output from the control section 36. The timing converting signal TCH is used to select one update signal from the update signals UDS0 to UDS3 and is set for each of the test circuits $33_1$ to $33_n$ according to the input timing of test data. The timing converting signal TCH held in the register 38 is supplied to a corresponding one of the test circuits $33_1$ to $33_n$.

FIG. 2 shows the main portion of the circuit of FIG. 1 and portions which are the same as those of FIG. 1 are denoted by the same reference numerals. The control section 36 includes a TAP (Test Access Port) control section 41 which follows the Standard of IEEE1149.1, instruction register 42, decoder 43 and multiplexer 44 used as selection means. The TAP control section 41 is supplied with the test mode selection signal TMS and test clock signal TCK. The TAP control section 41 is connected to the timing converting section 37 and instruction register 42. The TAP control section 41 sets various test states, controls the instruction register 42 and outputs the update signal UDS to the timing converting section 37 according to the states of the test mode selection signal TMS at the time of rise of the test clock signal TCK. Further, the TAP control section 41 creates and outputs the shift clock signal CKDR for shifting test data from the test clock signal TCK.

The instruction register 42 stores the test instruction INS according to the control of the TAP control section 41. The test instruction INS is serially input from the pad $36_1$ like the test data TD. The instruction register 42 is connected to the decoder 43 which is in turn connected to the multiplexer 44. The input terminal of the multiplexer 44 is supplied with the timing converting signal TCH or test data TD from the pad $36_1$. One output terminal A of the multiplexer 44 is connected to the test circuit $33_1$ via the scan path 35 and the other output terminal B thereof is connected to the register 38.

The decoder 43 decodes the test instruction stored in the instruction register 42. The multiplexer 44 selects one of the register 38 and test circuit $33_1$ according to the output signal of the decoder 43. When the multiplexer 44 selects the register 38, the register 38 holds the timing converting signal TCH supplied via the multiplexer 44. For example, the timing converting signal TCH is constructed by a 2-bit signal for each of the test circuits $33_1$ to $33_n$ and the 2-bit signals are supplied to the test circuits.

The timing converting section 37 outputs a plurality of update signals UDS0 to UDS3 according to the update signal UDS supplied from the TAP control section 41. The output timings of the update signals UDS0 to UDS3 are different from one another. That is, the timing converting section 37 has delay circuits DL1 to DL3, and the delay circuits DL1 to DL3 respectively have delay times of 5 ns, 10 ns and 20 ns, for example. The update signals UDS1 to UDS3 having the above delay times are output from the delay circuits DL1 to DL3. The update signal UDS0 is a signal having delay time of "0". In FIG. 2, the construction for outputting test data is omitted.

Figure 6:
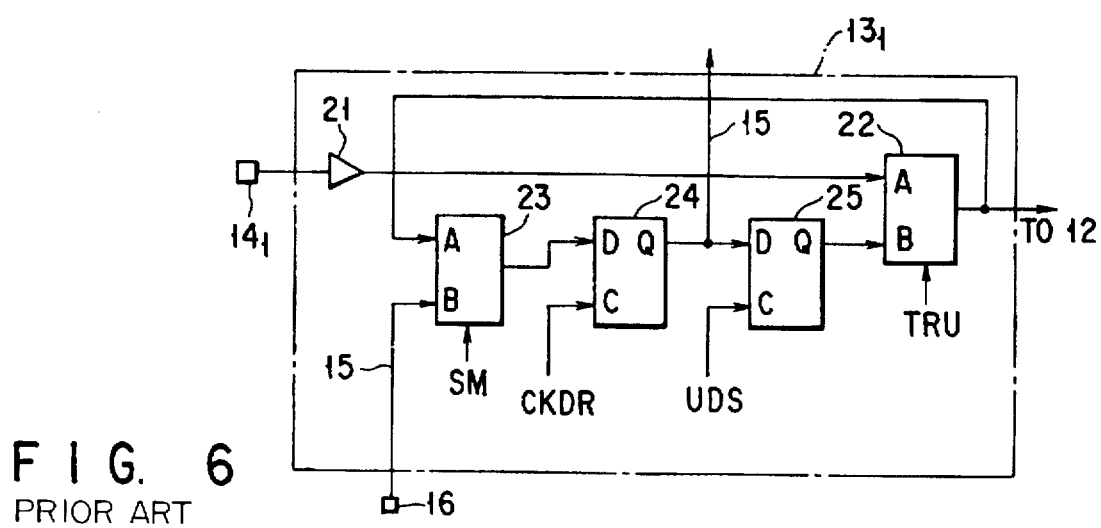
FIG. 6 is a circuit diagram concretely showing the main portion of the circuit of FIG. 5.

FIG. 3 shows the construction of the test circuit $33_1$, portions which are the same as those of FIG. 6 are denoted by the same reference numerals, and only the different portions are explained. The other test circuits $33_2$ to $33_j$ have the same construction as the test circuit $33_1$. In the test circuit $33_1$, the clock signal input terminal of the flip-flop circuit 25 is connected to the output terminal of a multiplexer (MPX) 45 acting as selecting means. The input terminal of the multiplexer 45 is supplied with update signals UDS0 to UDS3 output from the timing converting section 37. Further, the control signal input terminal of the multiplexer 45 is supplied with timing converting signals T0, T1 output from the register 38 and selects one of the update signals UDS0 to UDS3 according to the timing converting signals T0, T1.

FIG. 4 shows the construction of the test circuit $33_j$ on the output side and the other test circuits on the output side have the same construction as the test circuit $33_j$. The test circuit $33_j$ has substantially the same construction as the test circuit shown in FIG. 3, portions which are the same as those of FIG. 3 are denoted by the same reference numerals, and only the different portions are explained. In the test circuit $33_j$, data output from the internal circuit 32 is supplied to one input terminal of the multiplexer 22 and one input terminal of the multiplexer 23. The output terminal of the multiplexer 22 is connected to the output pad $34_j$. The other input terminal of the multiplexer 23 is connected to the scan path 35. The multiplexer 23 is controlled by the shift mode switching signal SM and the output terminal of the multiplexer 23 is connected to the input terminal of a flip-flop circuit 24. The clock signal input terminal of the flip-flop circuit 24 is supplied with the shift clock signal CKDR and the output terminal thereof is connected to a next stage test circuit (not shown) via the scan path 35 and to the input terminal of a flip-flop circuit 25. The flip-flop circuit 24 transfers latched data to the next stage test circuit via the scan path 35 in response to the shift clock signal CKDR in the boundary scan test mode.

The clock signal input terminal of the flip-flop circuit 25 is supplied with the update signal UDS and the output terminal thereof is connected to the other input terminal of the multiplexer 22. The flip-flop circuit 25 is operated in the checking mode in which the operation of another semiconductor element (not shown) connected to the output pad $34_j$ is checked and supplies data latched in the flip-flop circuit 24 to the above semiconductor element (not shown) via the multiplexer 22 and output pad $34_j$ in response to the update signal UDS. The multiplexer 22 is supplied with the switching signal TRU. The multiplexer 22 selects the output signal of the internal circuit 32 in response to the switching signal TRU in the normal operation mode and selects the output signal of the flip-flop circuit 25 in response to the switching signal TRU in the checking mode.

The operation of the circuit with the above construction shown in FIGS. 1 to 4 is explained. In the boundary scan test mode, the TAP control section 41 sets the test instruction INS supplied to the output pad $34_1$ acting as the test data input terminal (TDI) into the instruction register 42 in response to the test mode selection signal TMS supplied in synchronism with the test clock signal TCK. The decoder 43 decodes the test instruction, and if the test instruction specifies inputting of the timing converting signal TCH, it selects the other output terminal B of the multiplexer 44. In this state, the multiplexer 44 sets the timing converting signal TCH input from the scan input terminal (TDI) into the register 38.

Figures 7, 8A, 8B:
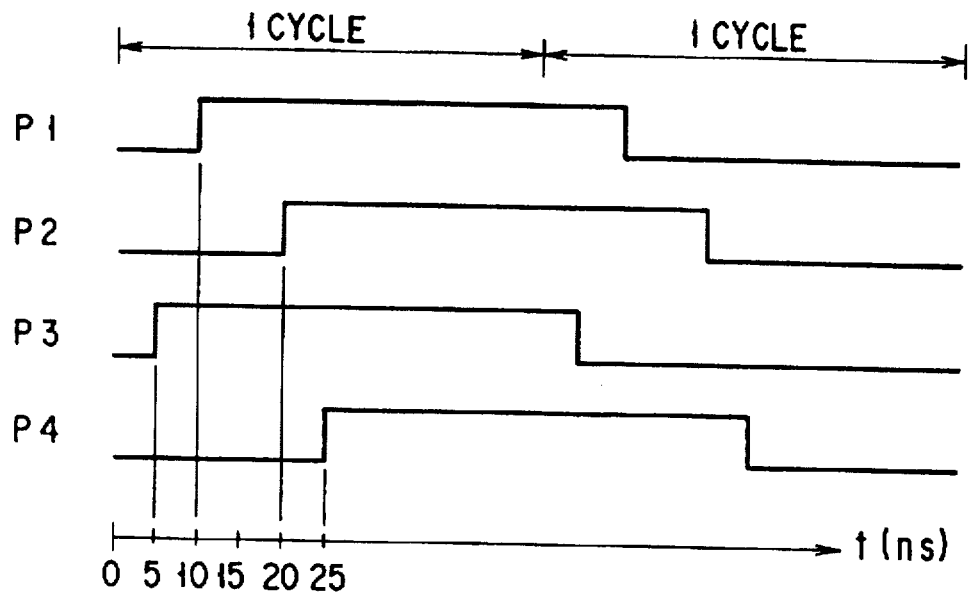
FIG. 7 is a timing chart for illustrating the operation of the circuit shown in FIGS. 5 and 6.
FIGS. 8A and 8B are diagrams for illustrating the operation of the circuit shown in FIGS. 5 and 6.

Next, the TAP control section 41 sets the test instruction INS supplied to the pad $34_1$ into the instruction register 42 in response to the test mode selection signal TMS supplied in synchronism with the test clock signal TCK. The decoder 43 decodes the test instruction, and if the test instruction specifies inputting of the test data TD, it selects one output terminal A of the multiplexer 44. In this state, the test data TD input from the pad $36_1$ is supplied to the test circuit $33_1$ via the multiplexer 44 and scan path 35. The test data TD is sequentially shifted in the test circuits $33_1$ to $33_j$ in response to the shift clock signal CKDR output from the TAP control section 41 and set into the flip-flop circuits 24 of the test circuits $33_1$ to $33_j$. Test data items set in the flip-flop circuits 24 of the test circuits $33_1$ to $33_j$ are all "1" as shown in the step 1 of FIG. 8A.

Next, if generation of the update signal is specified by the test mode selection signal TMS supplied in synchronism with the test clock signal TCK, the TAP control section 41 outputs the update signal UDS. The update signal UDS is supplied to the timing converting section 37 which in turn outputs a plurality of update signals UDS0 to UDS3 of different timings. The update signals UDS0 to UDS3 are supplied to the multiplexers 45 of the test circuits $33_1$ to $33_j$. The multiplexer 45 of each of the test circuits $33_1$ to $33_j$ selects one of the update signals according to the 2-bit timing converting signal supplied from the register 38. As a result, test data set in the flip-flop circuit 24 is supplied to the internal circuit 32 via the flip-flop circuit 25 and multiplexer 22 at a timing of the selected update signal. That is, test data items set in the flip-flop circuits 24 of the test circuits $33_1$ to $33_j$ are supplied to the internal circuit 32 at respective timings of selected update signals, for example, at timings shown in FIG. 7.

Test data supplied to the internal circuit 32 is set into the flip-flop circuits 24 of the test circuits $33_j$ to $33_n$ shown in FIG. 4 after being subjected to preset calculations and processes in the internal circuit 32. That is, in each of the test circuits $33_j$ to $33_n$, data output from the internal circuit 32 is set into the flip-flop circuit 24 via the multiplexer 23 in response to the shift mode switching signal SM. Data set in the flip-flop circuit 24 is sequentially shifted in the test circuits $33_j$ to $33_n$ in response to the shift clock signal CKDR and output from the pad $36_4$ via the control section 36.

According to the above embodiment, a plurality of update signals of different timings are created by the timing converting section 37, and each of the test circuits $33_1$ to $33_j$ selects one of the plurality of update signals according to the timing converting signal stored in the register 38 and supplies test data stored in the flip-flop circuit 24 to the internal circuit 32 at a timing of the selected update signal. Therefore, unlike the conventional case, the number of steps of test data can be reduced since it is not necessary to divide test data into a plurality of steps according to the test data input timings. Further, time required for set data to each test circuit can be reduced, whereby the number of steps of test data is small. Therefore, time required for the test can be reduced.

The number of update signals created in the timing converting section 37 and the delay times set for the update signals are not limited to the values used in the above embodiment, and can be adequately set according to the test data input timings.

What is claimed is:

1. A semiconductor circuit device, comprising:
   a semiconductor substrate having a circuit formed therein;
   a plurality of pads arranged on said semiconductor substrate and around said circuit;
   a plurality of test circuits arranged between said circuit and said pads, each test circuit having a first input terminal, a second input terminal, a third input terminal, a first output terminal, and a second output terminal, each said first input terminal being connected to a corresponding one of said pads and each said first output terminal being connected to said circuit, wherein each of said test circuits transfer signals from said pads to said circuit in a normal operation mode;

a scan path for serially connecting said test circuits via the second input terminals and the second output terminals thereof;

a control section, connected to one end of said scan path, for sequentially supplying test data to said test circuits via said scan path and for generating a first update signal; and a timing converting circuit, connected to said control section, for generating a plurality of second update signals having different delay times based on the first update signal supplied from said control section and supplying the second update signals to the third terminals of said test circuits, wherein each of said test circuits supplies test data to said circuit via the first output terminal thereof in response to one of the second update signals supplied from said timing converting circuit.

2. A device according to claim 1, wherein said control section includes:

a first input terminal for receiving a test instruction for selectively specifying various tests, test data used in the test mode, and a timing converting signal for converting the input timing of the test data;

a control circuit supplied with a test mode signal for setting the test mode, said control circuit generating a fetch signal for specifying a fetch of the test instruction, a shift clock signal for shifting the test data, and the first update signal for changing the timing of supply of the test data according to the test mode signal;

a first register connected to said control circuit for storing the fetched test instruction;

a decoder connected to said first register for decoding the test instruction supplied from said first register; and a first selection circuit having an input terminal connected to said first input terminal, a first output terminal and a second output terminal connected to said scan path, said first selection circuit selecting said first output terminal when the test instruction decoded by said decoder specifies an inputting of the timing converting signal and selecting said second output terminal when the test instruction decoded by said decoder specifies an inputting of test data.

3. A device according to claim 2, further comprising a second register connected to said first output terminal of said first selection circuit, said second register storing a plurality of timing converting signals output from said first output terminal of said first selection circuit.

4. A device according to claim 1, wherein said timing converting circuit includes a plurality of delay circuits having different delay times and said delay circuits generate the plurality of second update signals by delaying the first update signal by respective delay times.

5. A device according to claim 3, wherein each of said test circuits includes:

a first selection circuit having a first input terminal connected to a corresponding one of said pads, a second input terminal and an output terminal connected to said circuit, said first selection circuit supplying data input to said first input terminal to said circuit via said output terminal in the normal operation mode;

a latch circuit serially connected to another test circuit via said scan path in the test mode, said latch circuit latching the test data transferred via said scan path;

a second selection circuit connected to said timing converting circuit and to said second register, said second selection circuit selecting one of the plurality of second update signals supplied from said timing converting circuit according to the timing converting signal supplied from said second register; and a switching circuit connected between said output terminal of said latch circuit and said second input terminal of said first selection circuit, said switching circuit supplying test data latched in said latch circuit to said first selection circuit in response to the second update signal output from said second selection circuit.

6. A device according to claim 1, wherein said pads are arranged around the periphery of said circuit.

7. A semiconductor circuit device, comprising:

a semiconductor substrate having a circuit formed therein;

a plurality of pads formed on said semiconductor substrate;

a plurality of test circuits arranged between said circuit and said pads, each test circuit being connected to a corresponding one of said pads and to said circuit for transferring data from the corresponding pad to said circuit in a normal operation mode, and serially connected via a scan path, each of said test circuits having a latch circuit for latching test data transferred via said scan path in a test mode;

a control section for outputting a first control signal in the test mode;

a generating circuit, connected to said control section, for generating a plurality of second control signals having different output timings in response to the first control signal supplied from said control section;

a storing section for storing a plurality of third control signals for selecting the second control signals, the third control signals being supplied to said test circuits;

a selection circuit provided in each of said test circuits and connected to said storing section and to said generating circuit, said selection circuit selecting one of the plurality of second control signals supplied from said generating circuit according to one of the third signals stored in said storing section; and a switching circuit providing in each of said test circuits and connected to said selection circuit and to said latch circuit, said switching circuit supplying test data latched in said latch circuit at an output timing of the second control signal which is selected by said selection circuit.

8. A device according to claim 7, wherein said generating circuit includes a plurality of delay circuits having different delay times which generate the plurality of second control signals by delaying the first control signal.

9. A device according to claim 7, wherein said control section includes:

a first input terminal for receiving a test instruction for selectively specifying various tests, test data used in the test mode, and the third control signals;

a control circuit supplied with a test mode signal for setting the test mode, said control circuit generating a fetch signal for specifying a fetch of the test instruction, a shift clock signal for shifting the test data, and the first control signal according to the test mode signal;

a register connected to said control circuit for storing the fetched test instruction;

a decoder connected to said register for decoding the test instruction supplied from said register; and a first selection circuit having an input terminal connected to said first input terminal, a first output terminal and a second output terminal connected to said scan path, said first selection circuit selecting said first output terminal when the test instruction decoded by said decoder specifies an inputting of one of the third control signals and selecting said second output terminal when the test instruction decoded by said decoder specifies an inputting of test data.

10. A device according to claim 7, wherein said pads are arranged around the periphery of said circuit.

11. A semiconductor device, comprising:

a semiconductor substrate having a circuit formed therein;

a plurality of pads arranged on said semiconductor substrate;

a plurality of test circuits arranged between said circuits and said pads, each test circuit being connected to a corresponding one of said pads and to said circuit for supplying signals from the corresponding pad to said circuit;

a scan path for serially connecting said test circuits;

a control section formed on said semiconductor substrate, said control section including:

a first input terminal for receiving a test instruction for selectively specifying various tests, test data used in the test mode, and a timing converting signal for converting the input timing of the test data, a control circuit supplied with a test mode signal for setting the test mode, said control circuit generating a fetch signal for specifying a fetch of the test instruction, a shift clock signal for shifting the test data, and a first update signal for changing the timing of supply of the timing converting signal according to the test mode signal, a first register connected to said control circuit for storing the fetched test instruction, a decoder connected to said first register for decoding the test instruction supplied from said register, and a first selection circuit having an input terminal connected to said first input terminal, a first output terminal and a second output terminal connected to said scan path, said first selection circuit selecting said first output terminal when the test instruction decoded by said decoder specifies an inputting of the timing converting signal and selecting said second output terminal when the test instruction decoded by said decoder specifies an inputting of test data;

a second register connected to said first output terminal of said first selection circuit, said second register storing a plurality of timing converting signals output from said first output terminal of said first selection circuit; and a timing converting circuit connected to said control circuit for generating a plurality of second update signals having different delay times, wherein each of said test circuits includes:

a second selection circuit having a first input terminal connected to a corresponding one of said pads, a second input terminal and an output terminal connected to said circuit, said second selection circuit supplying data input to said first input terminal to said circuit from said output terminal in a normal operation mode;

a latch circuit serially connected to another test circuit via said scan path in the test mode, said latch circuit latching the test data transferred via said scan path;

a third selection circuit connected to said timing converting circuit and to said second register, said third selection circuit selecting one of the plurality of second update signals supplied from said timing converting circuit according to the timing converting signal supplied from said second register; and a switching circuit connected between said output terminal of said latch circuit and said second input terminal of said second selection circuit, said switching circuit supplying test data latched in said latch circuit to said second selection circuit in response to the second update signal output from said third selection circuit.

12. A device according to claim 11, wherein said timing converting circuit includes a plurality of delay circuits having different delay times and said delay circuits generate the plurality of second update signals by delaying the first update signal supplied from said control circuit by respective delay times.

13. A device according to claim 11, wherein said pads are arranged around the periphery of said circuit.

14. A semiconductor circuit device, comprising:

a semiconductor substrate having a circuit formed therein;

a plurality of input and a plurality of output pads arranged on said semiconductor substrate;

first and second test circuit groups, said first test circuit group including a plurality of test circuits each of which is connected to a corresponding one of said input pads and to said circuit, for supplying signals from said input pads to said circuit in a normal operation mode and said second test circuit group including a plurality of test circuits each of which is connected to a corresponding one of said output pads and to said circuit, for supplying signals output from said circuit to said output pads in the normal operation mode;

a scan path for serially connecting said first and second test circuit groups;

a control section connected to one end of said scan path for sequentially supplying test data to said first test circuit group via said scan path and generating a first update signal for transferring the test data to said circuit in a test mode; and a timing converting circuit connected to said control section for generating a plurality of second update signals having different delay times based on the first update signal supplied from said control section and supplying the second update signals to each of said first test circuit group, wherein said first test circuit group supplies the test data to said circuit in response to one of the second update signals supplied from said timing converting circuit, and said second test circuit group supplies data output from said circuit to said control section via said scan path.

15. A device according to claim 14, wherein said input and output pads are arranged around the periphery of said circuit.

16. A device according to claim 15, wherein the test circuits of said first and second test circuit groups are arranged between said input and output pads and said circuit.

17. A semiconductor circuit device, comprising:

a circuit;

a plurality of pads;

a plurality of test circuits arranged between said circuit and said pads, each test circuit having a first input terminal, a second input terminal, a third input terminal, a first output terminal and a second output terminal, each said first input terminal being connected to a corresponding one of said pads and each said first output terminal being connected to said circuit, wherein each of said test circuit transfers signals from said pads to said circuit in a normal operation mode;

a scan path for serially connecting said test circuits via the second input terminals and the second output terminals thereof;

a control section connected to one end of said scan path for supplying test data to said test circuits via said scan path and for generating a first transfer signal; and a signal generating circuit responsive to the first transfer signal for generating a plurality of second transfer signals having different delay times relative to the first update signal and supplying the second transfer signals to said third terminals of said test circuits, wherein each of said test circuits comprises a first selecting circuit for selecting one of the second transfer signals and supplies test data to said circuit via the first output terminal thereof at a timing based on the selected second transfer signal.

18. A device according to claim 17, wherein each of said test circuits further comprises:

a second selecting circuit having a first input terminal for inputting data, a second input terminal, and an output terminal connected to said circuit, said second selecting circuit supplying the data input to said first input terminal to said circuit via said output terminal in a normal operating mode and supplying test data input to said second input terminal to said circuit via said output terminal in a test mode;

a latch circuit for storing the test data supplied from said control section; and a switching circuit connected between an output terminal of said latch circuit and said second input terminal of said second selecting circuit, said switching circuit supplying the test data latched in said latch circuit to said second selecting circuit in response to the selected second transfer signal.

19. A device according to claim 17, wherein said control section comprises:

a first input terminal for receiving a test instruction for selectively specifying various tests, test data used in the test mode, and a timing converting signal for converting the input timing of the test data;

a control circuit supplied with a test mode signal for setting the test mode, said control circuit generating a fetch signal for specifying a fetch of the test instruction, a shift clock signal for shifting the test data, and the first transfer signal;

a first register connected to said control circuit for storing the fetched test instruction;

a decoder connected to said first register for decoding the test instruction supplied from said first register; and a second selecting circuit having an input terminal connected to said first input terminal, a first output terminal and a second output terminal connected to said test circuits, said second selecting circuit selecting said first output terminal when the test instruction decoded by said decoder specifies an inputting of the timing converting signal and selecting said second output terminal when the test instruction decoded by said decoder specifies an inputting of test data.

20. A device according to claim 19, further comprising a second register connected to said first output terminal of said second selecting circuit, said second register storing a plurality of timing conversion signals output from said first output terminal of said second selecting circuit.

21. A device according to claim 17, wherein said timing signal generating circuit includes a plurality of delay circuits having different delay times and said delay circuits generate the plurality of second transfer signals by delaying the first transfer signal by respective delay times.

22. A device according to claim 17, further comprising:

a scan path for serially connecting said test circuits.

* * * * *